United States Patent [19]

Takayama

[11] Patent Number: 4,802,126

[45] Date of Patent: Jan. 31, 1989

[54] SEMICONDUCTOR MEMORY DEVICE

[75] Inventor: Shigeru Takayama, Tokyo, Japan

[73] Assignee: NEC Corporation, Tokyo, Japan

[21] Appl. No.: 122,737

[22] Filed: Nov. 18, 1987

[30] Foreign Application Priority Data

Nov. 18, 1986 [JP] Japan .................... 61-275916

[51] Int. Cl.⁴ ................ G11C 7/00; G11C 11/00; G11C 11/34; G11C 17/00

[52] U.S. Cl. .................... 365/190; 365/156; 365/177; 365/94

[58] Field of Search ............ 365/153, 154, 156, 189, 365/190, 177, 230, 94

[56] References Cited

U.S. PATENT DOCUMENTS

| | | | |
|---|---|---|---|
| 4,606,010 | 8/1986 | Saito | 365/189 |
| 4,665,505 | 5/1987 | Miyakawa et al. | 365/177 |
| 4,713,796 | 12/1987 | Ogiue et al. | 365/189 |

Primary Examiner—Terrell W. Fears
Assistant Examiner—Melissa J. Koval
Attorney, Agent, or Firm—Sughrue, Mion, Zinn, Macpeak & Seas

[57] ABSTRACT

For preventing a semiconductor substrate from undesirable discharging of electric charges, there is disclosed a semiconductor memory device fabricated on the semiconductor substrate and having a read-out mode and a write-in mode, comprising: (a) a plurality of memory cells arranged in rows and columns and having read only memory cells and random access memory cells; (b) a plurality of word lines each operative to activate the memory cells of each row in the read-out mode and the write-in mode; (c) a plurality of first data lines each operative to propagate a voltage level; (d) a plurality of second data lines each paired with each of the first data lines to form a data line pair coupled to the memory cells of each column, each of the second data lines being operative to propagate the complementary voltage level of the voltage level on the first data line, the voltage level and the complementary voltage level representing a bit of data information; and (d) a plurality of read-write buffer circuits each coupled to each of the data line pair so as to transfer the bit of data information thereto, wherein each of the read only memory cells comprises a series combination of two transistors capable of providing a conduction path between one of the first and second data lines and a source of voltage in the read-out mode, at least one of the two transistors being operative to block the conduction path in the write-in mode.

7 Claims, 3 Drawing Sheets

PRIOR-ART

PRIOR-ART

SEMICONDUCTOR MEMORY DEVICE

FIELD OF THE INVENTION

This invention relates to a semiconductor memory device and, more particularly, to a semiconductor memory device with read only memory cells and random access memory cells.

BACKGROUND OF THE INVENTION

A typical example of the semiconductor memory device of the type having read only memory cells and random access memory cells is illustrated in FIG. 1 of the drawings. The semiconductor memory device illustrated in FIG. 1 comprises a plurality of memory cells 1 to 6 arranged in rows and columns, eight data lines extending in column directions, eight complementary data lines each paired with each of the data lines to form a data line pair, a plurality of word lines extending in row directions, and eight read-write buffer circuits each associated with each data line pair. The memory cells 1 to 3 are specified by address "m" and the memory cells 4 to 6 are also specified by address "n". In FIG. 1, only three of the data lines are designated by reference numerals 7, 8 and 9 together with the three complementary data lines 10, 11 and 12. Only one of the read-write buffer circuits 13 is shown in association with the data line 7 and the complementary data line 10. All of the data lines 7 to 9 and all of the complementary data lines 10 to 12 are coupled at one ends thereof to respective source-drain paths of gate transistors 14 to 19 which in turn is coupled to a source of positive voltage 20, and the gate transistors 14 to 19 are formed by p-channel type MOS field effect transistors, respectively. The data lines 7 to 9 are coupled at the other ends thereof to a multi-bit data bus 21 and inverter circuits 22 to 24 intervene between the other ends of the data lines 7 to 9 and the other ends of the complementary data lines 10 to 12, respectively. In this example, the data lines 7, 8 and 9 propagate bits "7", "6" and "0", respectively. All of the gate transistors 14 to 19 have respective gate electrodes commonly coupled to a signal line 25 where a precharge signal PC of an active low level appears so that the source of positive voltage 20 charges up all of the data lines 7 to 9 and the complementary data lines 10 to 12 in the presence of the precharge signal PC of a ground voltage level.

The memory cells consists of random access memory cells and read only memory cells mixed with the random access memory cells. In detail, the memory cells 1, 3 and 5 are the random access memory cells but the memory cells 2, 4 and 6 are the read only memory cells. Each random access memory cell such as, for example, 1 comprises two memory nodes 26 and 27, a series combination of a p-channel type MOS field effect transistor 28 and an n-channel type MOS field effect transistor 29 capable of providing a conduction path between the source of positive voltage 20 and a ground terminal, a series combination of a p-channel type MOS field effect transistor 30 and an n-channel type MOS field effect transistor 31 capable of providing a conduction path between the source of positive voltage 20 and the ground terminal, and two n-channel type MOS field effect transistors 32 and 33 capable of providing respective conduction paths between the memory nodes 26 and 27 and the data line pair. The MOS field effect transistors 28 and 29 have respective gate electrodes commonly coupled to the memory node 27 so that the MOS field effect transistors 28 and 29 are complementarily shifted between on-states and off-states to put a positive high voltage level or the ground voltage level on the memory node 26. Similarly, the MOS field effect transistors 30 and 31 have respective gate electrodes commonly coupled to the memory node 26 so that the MOS field effect transistors 30 and 31 are also shifted between on-state and off-state to put the complementary voltage level on the memory node 27. The two n-channel MOS field effect transistors 32 and 33 have respective gate electrodes commonly coupled to one of the word lines 34 and the word line 34 is coupled to the output node of an AND gate 35 which has two input nodes applied with the precharge signal PC and a selecting signal SC fed from a row decoder circuit ( not shown ). Then, when the selecting signal SC of the positive high voltage level is supplied to one of the input nodes of the AND gate 35 after recovery of the precharge signal PC, the AND gate 35 produces an output signal of the positive high voltage level which is applied to the respective gate electrodes of the n-channel type MOS field effect transistors 32 and 33, so that the n-channel type MOS field effect transistors 32 and 33 concurrently turn on to allow an external device to access a bit of data information in the form of complementary voltage levels stored in the memory nodes 26 and 27.

On the other hand, each read only memory cell comprises an n-channel type MOS field effect transistor 36 capable of providing a source-drain path between one of the data line and the complementary data line and the ground terminal and the n-channel type MOS field effect transistor 36 has a gate electrode coupled to one of the word lines. Namely, the read only memory cell such as the cell 2 provides a conduction path between the data line 8 and the ground terminal and, on the other hand, the read only memory cell such as the cell 4 provides a conduction path between the complementary data line 10 and the ground terminal. The read only memory cell thus arranged pulls down the voltage level on either of the paired data lines so that a bit of data information stored therein is decided by detecting the voltage levels on the paired data lines.

All of the read-write buffer circuits incorporated in the semiconductor memory device illustrated in FIG. 1 are similar in circuit arrangement to one another so that description will be focused on the read-write buffer circuit 13, only. The read-write buffer circuit 13 comprises a latch circuit consisting of two NAND gates 37 and 38, two n-channel type MOS field effect transistors 39 and 40 and two p-channel type MOS field effect transistors 41 and 42, an output buffer circuit 43, and two input buffer circuits 44 and 45. The latch circuit is operative to store a bit of data information in the form of complementary voltage levels appearing on the data line and the complementary data line 7 and 10, respectively. The buffer circuit 43 has a control terminal applied with a read control signal RD and the buffer circuit 43 is operative to transfer the bit of data information stored in the latch circuit to the data bus 21 in the presence of the read control signal RD. On the other hand, the input buffer circuits 44 and 45 are activated by a two-input AND gate supplied with a write control signal WR and a timing clock signal CLK and are operative to transfer a bit of data information in the form of complementary voltage levels fed from the data bus 21 to the data line 7 and the complementary data line 10, respectively.

As to the memory cells 4 to 6, they are associated with a work line 47 which is supplied with an activation signal of the positive high voltage level from an AND gate 48.

Now, description will be hereinunder made for a write-in operation and two read-out operations on the assumption that memory cells of the address "m" store a data information consisting of a string of bits designated by letter "m" in FIG. 2 and that the memory cells of the address "n" store a data information consisting of a string of bits designated by letter "n" in FIG. 2. As will be understood from the FIG. 2, the read only memory cells 2, 4 and 6 respectively store bits "0", "1" and "0". M7 and M5 to M0 represent the respective bits of data information stored in the random access memory cells of the address "m" and the N6 to N1 also represent the respective bits of data information stored in the random access memory cells of the address "n". Each of the bits stored in the random access memory cells of both of the addresses "m" and "n" is either logic "0" or "1". When an external control device such as a microprocessor accesses the memory cell 1 to read-out the bit of data information, the microprocessor supplies the semiconductor device illustrated in FIG. 1 with an address signal representing the address m together with some control signals such as, for example, a chip enable signal. With the control signals, a control circuit (not shown) incorporated in the semiconductor memory device produces the precharge signal PC of the active ground voltage level so that all of the gate transistors 14 to 19 turn on to provide the conduction paths between the source of positive voltage 20 and the respective data lines 7 to 9 and the complementary data lines 10 to 12. The selecting signal SC has been in the high voltage level in the presence of the address signal representing the address "m", then, after recovery of the precharge signal PC, the AND gate 35 allows the word line 34 to go up to the active high voltage level. With the active high voltage level on the word line 34, all of the n-channel type MOS field effect transistors with the gate electrodes coupled to the word line 34 turn on. The n-channel type MOS field effect transistors 32 and 33 turn on to couple one of the data line 7 and the complementary data line 10 to the ground terminal depending upon the bit of data informtion M7, then a difference in voltage level which forms complementary voltage levels appears between the data line 7 and the complementary data line 10. When the timing clock signal CLK goes up to the positive high voltage level, the complementary voltage levels are latched by the latch circuit through the n-channel type MOS field effect transistors 39 and 40 in on-states. In this example, when the bit M7 of logic "0" is stored in the random access memory cell 1, the n-channel type MOS field effect transistor 31 is turned on to discharge the positive electric charges supplied from the source of positive voltage 20, thereby putting the ground voltage level and the positive high voltage level on the data line 7 and the complementry data line 10, respectively. On the other hand, if the random access memory cell 1 stores the bit M7 of logic "1", the complementary data line 10 is discharged through the n-channel type MOS field effect transistor 29. After the bit M7 is stored in the latch circuit, the bit M7 is read out to the data bus 21 through the output buffer circuit 43 in the presence of the read control signal RD.

In write-in operation, when the AND gate 35 allows the word line 34 to go up to the positive high voltage level, all of the n-channel type MOS field effect transistors including the transistors 32 and 33 turn on, again. With the write control signal WR and the timing clock signal CLK concurrently in the positive high voltage level, a voltage level appearing on the data bus 21 are transferred to the data line 7 through the input buffer circuit 45 and the inverse thereof is fed from the inverter circuit 22 to the complementary data line 10 through the input buffer circuit 44. The n-channel type MOS field effect transistors 32 and 33 have been turned on so that a new data bit consisting of the voltage level on the data line 7 and the inverse thereof on the complementary data line 10 passes through the n-channel type MOS field effect transistors 32 and 33 and reaches the memory nodes 26 and 27. If the new bit is equal in logic level to the previously stored bit, the series combination of the MOS field effect transistors 28 and 29 and the series combination of the MOS field effect transistors 30 and 31 are not shifted, however if the new bit is different in logic level from the previously stored bit, the MOS field effect transistors 28 and 29 and the MOS field effect transistors 30 and 31 are complementarily shifted to change the voltage levels on the memory nodes 26 and 27, respectively.

If the microprocessor needs to access the read only memory cell 4 to read out the bit of the data information, the microprocessor supplies the semiconductor memory device with an address signal representing the address "n" together with the control signals. In the first stage of the read-out operation, the precharge signal PC goes down to the active ground level so that the gate transistors 14 to 19 turn on to allow the source of positive high voltage 20 to charge up the data lines 7 to 9 and the complementary data lines 10 to 12. Subsequently, when a selecting signal SC is applied to the AND gate 48 after recovery of the precharge signal PC, the n-channel type MOS field effect transistor 36 turns on to provide the conduction path between the complementary data line 10 to the ground terminal, so that the complementary data line 10 is discharged to the ground voltage level but the data line 7 keeps the positive high voltage level. Then, a difference in voltage level appears between the data line 7 and the complementary data line 10 to form complementary voltage levels. This complementary voltage levels represent the bit of logic "1" which is read out to the data bus 21 in a similar manner to the read-out operating for the random access memory cell 1.

However, a problem is encountered in the prior-art semiconductor memory device in limitation to a bit string of a data information written in the memory cells. In detail, when the bit of logic "1" is fed from the data bus 21 to the paired data lines 7 and 10 through the input buffer circuits 45 and 44, the complementary data line 10 is in the ground voltage level. In this situation, if the read only memory cell 4 is selected by the word line 47, no substantial discharging takes place through the read only memory cell 4, so that the semiconductor memory device does not have any trouble. However, when the bit of logic "0" is supplied from the data bus 21 to the paired data lines 7 and 70, the input buffer circuit 44 causes the complementary data line 10 to go up to the positive high voltage level, so that the positive electric charges are discharged from the complementary data line 10 to a substrate (not shown) through the read only memory cell 4 in the on-state. This discharging is undesirable for the semiconductor memory device so that the data information should have the seventh bit of logic "1".

SUMMARY OF THE INVENTION

It is therefore an important object of the present invention to provide a semiconductor memory device which is free from the problem inherent in the prior-art semiconductor memory device.

It is another important object of the present invention to provide a semiconductor memory device which has no limitation to the bit string of a data information written in the memory cells.

To accomplish these objects, the present invention proposes to cut off a conduction path passing through a read only memory cell.

In accordance with the present invention, there is provided a semicondutor memory device fabricated on a semiconductor substrate and having a read-out mode and a write-in mode, comprising: (a) a plurality of read only memory cells and random access memory cells arranged in rows and columns to form a memory cell array; (b) a plurality of word lines each operative to activate the memory cells of each row in the read-out mode and the write-in mode; (c) a plurality of first data lines each operative to propagate a voltage level; (d) a plurality of second data lines each paired with each of the first data lines to form a data line pair coupled to the memory cells of each column, each of the second data lines being operative to propagate the complementary voltage level of the voltage level on the first data line, the voltage level and the complementary voltage level representing a bit of data information; and (d) a plurality of read-write buffer circuits each coupled to each of the data line pair so as to transfer the bit of data information thereto, wherein each of the read only memory cells comprises a series combination of two transistors capable of providing a conduction path between one of the first and second data lines and a source of voltage in the read-out mode, at least one of the two transistors being operative to block the conduction path in the write-in mode. The two transistors may be formed by two n-channel type field effect transistors with respective gate electrodes on of which is coupled to one of the word line and the other of which is coupled to the other of said first and second data lines. The read-write buffer circuit may be shifted from the read-out mode to the write-in mode in the presence of a write control signal and the inverse of the write control signal may be supplied to the other gate electrode to cause the field effect transistor to turn off.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 1:
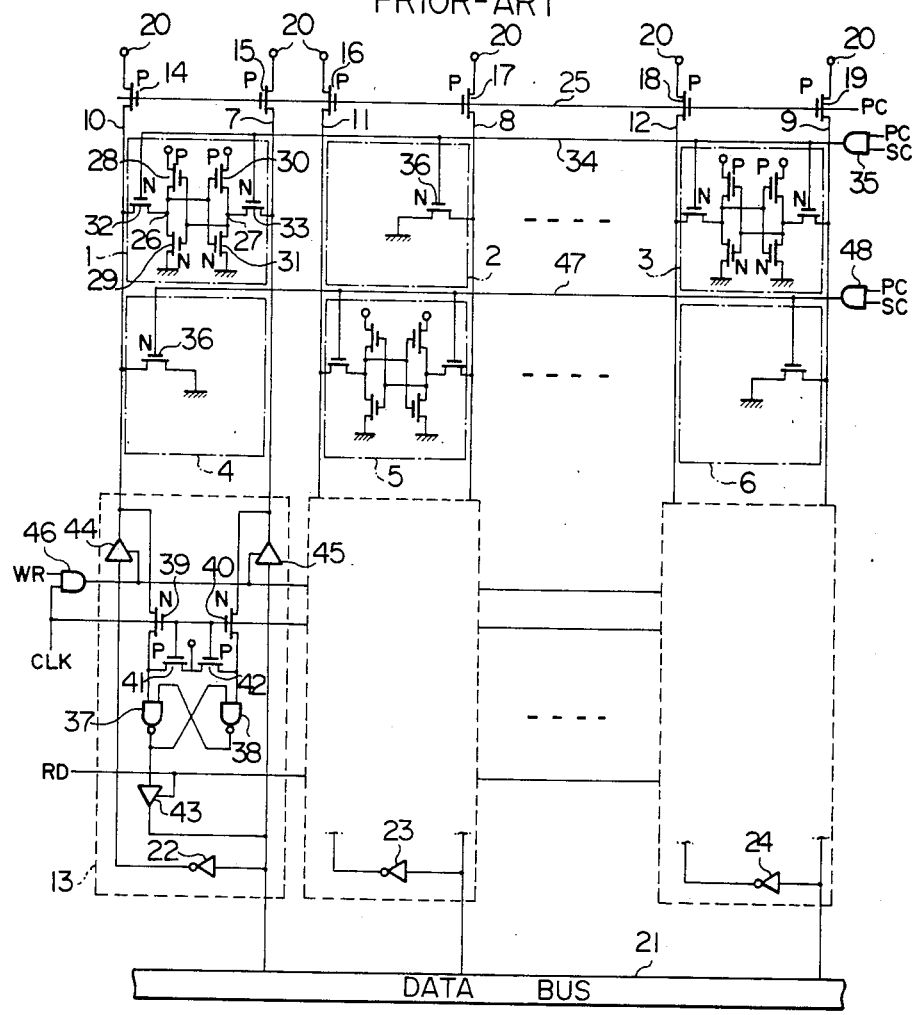
FIG. 1 is a block diagram showing the arrangement of a typical example of the prior-art semiconductor memory device with read only memory cells and random access memory cells.
Figure 2:
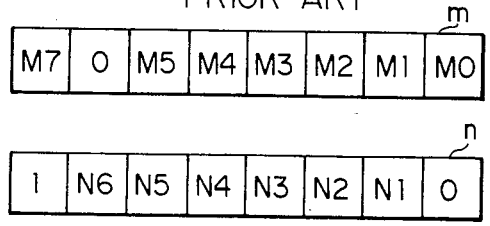
FIG. 2 is a view showing bit strings of data informations stored in the addresses "m" and "n" of the memory cells, respectively.
Figure 3:
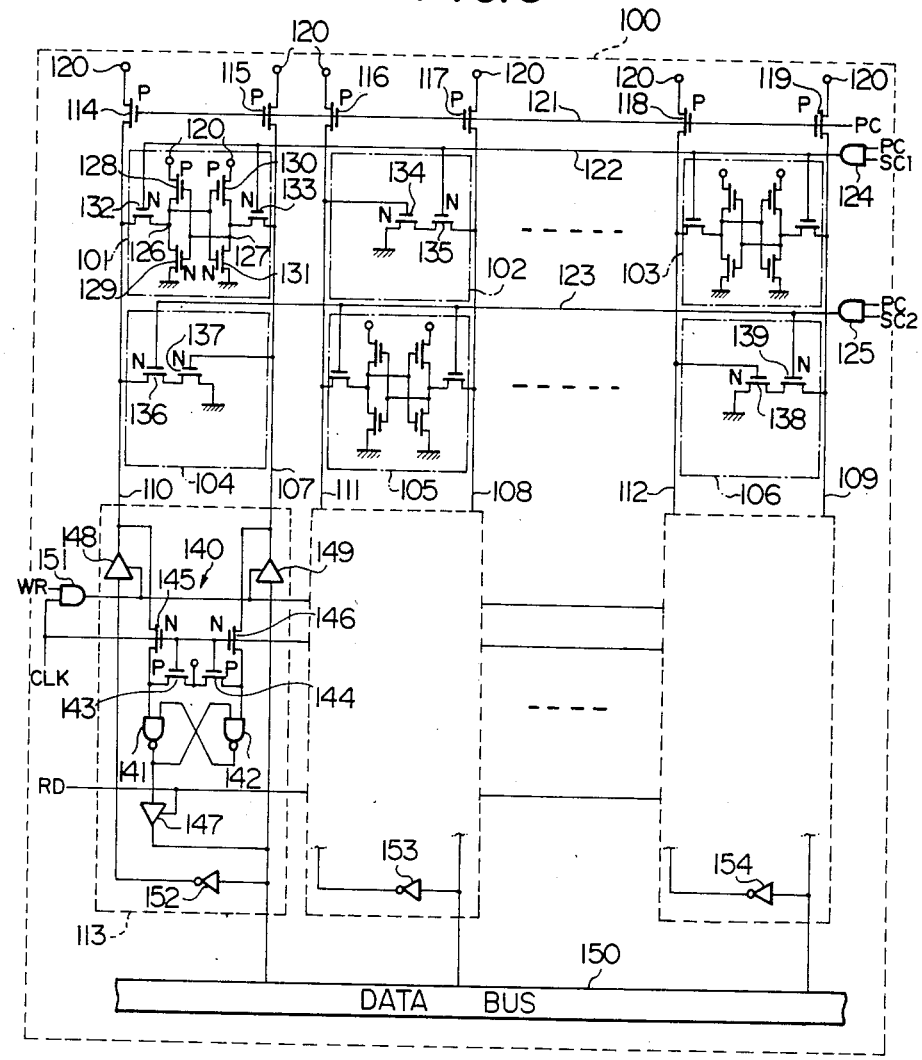
FIG. 3 is a block diagram showing the arrangement of a semiconductor memory device embodying the present invention.

Reffering to FIG. 3 of the drawings, there is shown the circuit arrangement of a semiconductor memory device embodying the present invention which is fabricated on a semiconductor substrate 100. The semiconductor memory device illustrated in FIG. 3 comprises a plurality of memory cells arranged in rows and columns. However, FIG. 3 shows first and second rows the former of which has two random access memory cells 101 and 103 and a read only memory cell 102 and the latter of which includes two read only memory cells 104 and 106 and a random access memory cell 105. Three data lines 107, 108 and 109 are respectively paired with three complementary data lines 110, 111 and 112 to form three data line pairs and each of the data line pairs are coupled to the memory cells in each column. Each data line pair is further coupled to a read-write buffer circuit, and, for example, the data line pair consisting of the data line 107 and the complementary data line 110 is associated with the read-write buffer circuit 13. The data lines 107, 108 and 109 and the complementary data lines 110, 111 and 112 are coupled through source-drain paths of gate transistors 114, 115, 116, 117, 118 and 119 to a source of positive voltage 120 and each of the gate transistors is formed by an n-channel type MOS field effect transistor. All of the gate transistors have respective gate electrodes commonly coupled to a signal line 121 where a precharge signal PC of an active ground level appears. The memory cells 101 to 103 are accompanied by a word line 122 and, on the other hand, the memory cells 104 to 106 are accompanied by a word line 123. The word lines 122 and 123 respectively propagate activation signals of a positive high voltage level for activation of the memory cells and the activation signals are produced by two-input AND gates 124 and 125, respectively. The AND gate 124 produces the activation signal when a decoded address signal SC1 of the positive high voltage level is supplied from a row decoder circuit (not shown) to the AND gate 124 after recovery of the precharge signal PC, and the AND gate 125 produces the activation signal when another decoded address signal SC2 of the positive high voltage level appears at one of the input nodes after recovery of the precharge signal PC.

All of the random access memory cells are similar in circuit arrangement to one another so that the random access memory cells 1 is hereinunder described in detail but the other random access memory cells are not described for the sake of simplicity. The random access memory cell 1 comprises comprises two memory nodes 126 and 127, a series combination of a p-channel type MOS field effect transistor 128 and an n-channel type MOS field effect transistor 129 capable of providing a conduction path between the source of positive voltage 120 and a ground terminal, a series combination of a p-channel type MOS field effect transistor 130 and an n-channel type MOS field effect transistor 131 capable of providing a conduction path between the source of positive voltage 120 and the ground terminal, and two n-channel type MOS field effect transistors 132 and 133 capable of providing respective conduction paths between the memory nodes 126 and 127 and the data line pair consisting of the complementary data line 110 and the data line 107, respectively. The MOS field effect transistors 128 and 129 have respective gate electrodes commonly coupled to the memory node 127 so that the MOS field effect transistors 128 and 129 are complementarily shifted between on-state and off-state to put the positive high voltage level or the ground voltage level on the memory node 26. Similarly, the MOS field effect transistors 130 and 131 have respective gate electrodes commonly coupled to the memory node 126 so that the MOS field effect transistors 130 and 131 are also shifted between on-state and off-state to put the complementary voltage level on the memory node 127. The two n-channel MOS field effect transistors 132 and 133 have respective gate electrodes commonly coupled to the word line 122 so that the activation signal on the word line 122 allows the n-channel type MOS field effect transistors 132 and 133 to turn on to provide the conduction paths. When the n-channel type MOS field effect transistors 132 and 133 turn on, the data line 107 and the complementary data line 110 are electrically connected to the memory nodes 127 and 126 through the respective conduction paths of the n-channel type MOS field effect transistors 133 and 132. With the electrical connections between the data line pair and the memory nodes 126 and 127, a bit of data information in the form of complementary voltage levels is read out from the random access memory cell 1 to the data line pair and a new bit of a data information is written into the random access memory cell 1. Description for the read only memory cells 102, 104 and 106 follows.

As described hereinbefore, the memory cells includes the read only memory cells mixed with the random access memory cells. FIG. 3 shows three read only memory cells designated by reference numerals 102, 104 and 106. Each of the read only memory cells 102, 104 and 106 is formed by a series combination of two n-channel type MOS field effect transistors 134 and 135, 136 and 137 or 138 and 139 capable of providing a conduction path between the data line or the complementary data line and the ground terminal depending upon the bit of data information stored therein. In detail, the memory cell 102 has the two n-channel type MOS field effect transistors 134 and 135 the former of which has a gate electrode coupled to the complementary data line 111 and the latter of which has a gate electrode coupled to the word line 122 because the memory cell 102 is designed to store the bit of data information of logic "0". On the other hand, the memory cell 104 has the two n-channel type MOS field effect transistors 136 and 137 the former of which has a gate electrode coupled to the word line 123 and the latter of which has a gate electrode coupled to the data line 107 because the memory cell 104 is designed to store the bit of information of logic "1". The memory cell 106 is designed to store the bit of data information of logic "0" so that the two n-channel type MOS field effect transistors 138 and 139 have respective gate electrodes coupled to the complementary data line 112 and the word line 123, respectively.

The semiconductor memory device illustrated in FIG. 3 further comprises the read-write buffer circuit 113 which comprises a latch circuit 140 consisting of two NAND gates 141 and 142, two p-channel type MOS field effect transistors 143 and 144 and two n-channel type MOS field effect transistors 145 and 146, an output buffer circuit 147, and two input buffer circuits 148 and 149. The latch circuit 149 is operative to store a bit of data information in the form of complementary voltage levels appearing on the data line pair. The output buffer circuit 147 has a control terminal applied with a read control signal RD and the output buffer circuit 147 is operative to transfer a bit of data information stored in the latch circuit 140 to a data bus 150 in the presence of the read control signal RD. On the other hand, the input buffer circuits 148 and 149 are activated by an two-input AND gate 151 supplied with a write control signal WR of an active high voltage level and a timing clock signal CLK and are operative to transfer a bit of data information in the form of complementary voltage levels fed from the data bus 150 to the data line pair. The data lines 107 to 109 are coupled to the complementary data lines 110 to 112 through inverter circuits 152, 153 and 154, respectively, so that each data line pair propagates complementary voltage levels representing the bit of data information of either logic "1" or "0".

The read out operation and the write-in operation of each random access memory cell 101, 103 or 105 is similar to those of the random access memory cell 1 so that description is omitted for the sake of simplicity. Description for operations is focused on the read only memory cells 102 and 104.

If the microprocessor needs to access the read only memory cell 102 to read out the bit of the data information stored therein, the microprocessor supplies the semiconductor memory device with control signals including a chip enable signal and, thereafter, an address signal representing the address for the first row. In the first stage of the read-out operation, the precharge signal PC goes down to the active ground level so that the gate transistors 114 to 119 turn on to allow the source of positive high voltage 120 to charge up the data lines 107 to 109 and the complementary data lines 110 to 112 to the positive high voltage level. After a predetermined time period, the precharge signal PC goes up to the non-active high voltage level so that the gate transistors 114 to 119 turn off to cut off the conduction paths between the source of positive voltage 120 to the data line pairs. Upon completion of charging up operation, the n-channel type MOS field effect transistor 134 turns on to partially provide the conduction path. Subsequently, when the address signal fed from the microprocessor is decoded, the decoded address signal SC1 goes up to the active high voltage level, then the AND gate 124 produces the activation signal of the positive high voltage level which is transferred to the word line 122. With the activation signal appearing on the word line 122, the n-channel type MOS field effect transistor 135 turns on to provide the conduction path between the data line 108 to the ground terminal, so that the data line 108 is discharged to the ground voltage level but the complementary data line 111 keeps the positive high voltage level. Then, a difference in voltage level appears between the data line 108 and the complementary data line 111 to form the complementary voltage levels representing the bit of data information of logic "0". This complementary voltage levels representing the bit of logic "0" is latched by the associated latch circuit and, thereafter, transferred to the data bus 150 through output buffer circuit in the presence of the read control signal RD. Similarly, If the microprocessor needs to access the read only memory cell 104 to read out the bit of the data information stored therein, the microporcessor supplies the semiconductor memory device with control signal including a chip enable signal and, thereafter, an address signal representing the address for the second row. In the first stage of the read-out operation, the precharge signal PC goes down to the active ground level so that the gate transistors 114 to 119 turn on to allow the source of positive high voltage 120 to charge up the data lines 107 to 109 and the complementary data lines 110 to 112 to the positive high voltage level. After a predetermined time period, the precharge signal goes up to the non-active high voltage level so that the gate transistors 114 to 119 turn off to cut off the conduction paths between the source of positive voltage 120 to the data line pairs. Upon completion of charging up operation, the n-channel type MOS field effect transistor 137 turns on to partially provide the conduction path. Subsequently, when the address signal fed from the microprocessor is decoded, the decoded address signal SC2 goes up to the active high voltage level, then the AND gate 125 produces the activation signal of the positive high voltage level which is transferred to the word line 123. With the activation signal appearing on the word line 123, the n-channel type MOS field effect transistor 136 turns on to fully provide the conduction path between the complementary data line 110 to the ground terminal, so that the complementary data line 110 is discharged to the ground voltage level but the data line 107 keeps the positive high voltage level. Then, a difference in voltage level appears between the data line 107 and the complementary data line 110 to form the complementary voltage levels representing the bit of data information of logic "1". This complementary voltage levels representing the bit of logic "1" is latched by the latch circuit 140 and, thereafter, transferred to the data bus 150 through output buffer circuit 147 in the presence of the read control signal RD.

As will be understood from the above description, the read only memory cells 102 and 104 store the bits of data informations of logic "0" and logic "1", respectively. In this arrangement, there is no problem to supply the data line pairs with the bits of data informations equal in logic level to those stored in the memory cells of the first or second row in a write-in operation. Moreover, the semiconductor memory device according to the present invention has no problem even if the bit of data information opposite in logic level to that stored in the read only memory cell 102 or 104 is supplied from the data bus 150 to the data line pair. Namely, when the bit of data information of logic "0" is fed to the data line pair consisting of the data line 107 and the complementary data line 110, the complementary data line 110 goes up to the positive high voltage level but the data line 107 remains in the ground voltage level. Then, the n-channel type MOS field effect transistor 137 keeps the off-state. This results in no conduction path between the complementary data line 110 and the ground terminal, thereby preventing the substrate 100 from discharging of the positive electric charges. Similarly, when the bit of data information of logic "1" is fed to the data line pair consisting of the data line 108 and the complementary data line 111, the data line 108 goes up to the positive high voltage level but the complementary data line 111 remains in the ground voltage level. Then, the n-channel type MOS field effect transistor 134 keeps the off-state. This results in no conduction path between the data line 108 and the ground terminal, thereby preventing the substrate 100 from discharging of the positive electric charges.

Second Embodiment

Figure 4:
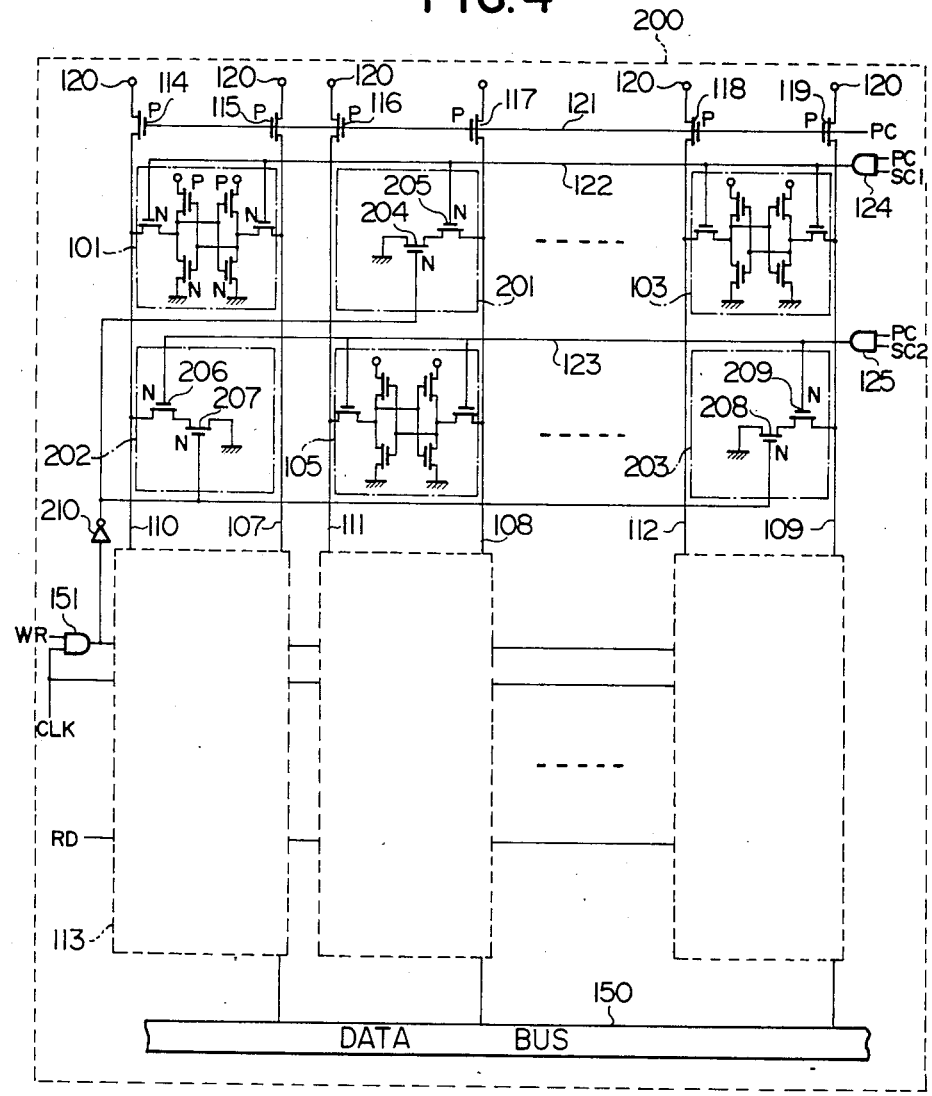
FIG. 4 is a block diagram showing the arrangement of another semiconductor memory embodying the present invention.

Turning to FIG. 4 of the drawings, there is shown the circuit arrangement of another semiconductor memory device embodying the present invention which is also fabricated on a semiconductor substrate 200. The semiconductor memory device illustrated in FIG. 4 has similar component elements to those of the semiconductor memory device illustrated in FIG. 3 except for read only memory cells 201, 202 and 203, so that the component elements are designated by like reference numerals used for the counter parts in FIG. 3 for the sake of simplicity.

Each of the read only memory cells 201 and 203 comprises a series combination of two n-channel type MOS field effect transistors 204 and 205, 206 and 207 or 208 and 209. The n-channel type MOS field effect transistor 205 of the read only memory cell 201 has a gate electrode coupled to the word line 122 and the n-channel type MOS field effect transistors 206 and 209 of the read only memory cells 202 and 203 have respective gate electrodes commonly coupled to the word line 123. However, the n-channel type MOS field effect transistors 204, 207 and 208 have respective gate electrodes commonly coupled to the AND gate 151 through an inverter circuit 210 so that no conduction path is produced between the data line or the complementary data line and the ground terminal in the write-in operation, thereby preventing the substrate from discharging of the positive electric charges.

Although particular embodiment of the present invention have been shown and described, it will be obvious to those skilled in the art that various changes and modifications may be made without departing from the spirit and scope of the present invention.

What is claimed is:

1. A semiconductor memory device fabricated on a semiconductor substrate and having a read-out mode and a write-in mode, comprising:
   (a) a plurality of read only memory cells and random access memory cells arranged in rows and columns to form a memory cell array;
   (b) a plurality of word lines each operative to activate said memory cells of each row in said read-out mode and said write-in mode;
   (c) a plurality of first data lines each operative to propagate a voltage level;
   (d) a plurality of second data lines each paired with each of said first data lines to form a data line pair coupled to said memory cells of each column, each of said second data lines being operative to propagate the complementary voltage level of said voltage level on the first data line, said voltage level and the complementary voltage level representing a bit of data information; and
   (d) a plurality of read-write buffer circuits each coupled to each of said data line pair so as to transfer said bit of data information thereto, wherein each of said read only memory cells comprises a series combination of two transistors capable of providing a conduction path between one of said first and second data lines and a source of voltage in said read-out mode, at least one of said two transistors being operative to block said conduction path in said write-in mode.

2. A semiconductor memory device as set forth in claim 1, in which said two transistors of each read only memory cell are formed by two field effect transistors of with respective channels of one conductivity type.

3. A semiconductor memory device as set forth in claim 2, in which one of said field effect transistors has a gate electrode coupled to one of said word lines and the other of said field effect transistors has a gate electrode coupled to the other of said first and second data lines.

4. A semiconductor memory device as set forth in claim 2, in which said two field effect transistors are of an n-channel type.

5. A semiconductor memory device as set forth in claim 1, in which said read-write buffer circuit is shifted from said readout mode to said write-in mode when a write control signal is supplied thereto and in which said two transistors are formed by two field effect transistors with respective channel of one conductivity type, wherein one of said field effect transistors has a gate electrode coupled to one of said word lines and the other of said field effect transistors has a gate electrode supplied with the inverse of said write control signal in said write-in mode.

6. A semiconductor memory device fabricated on a semiconductor substrate and having a read-out mode and a write-in mode, comprising:
 (a) a plurality of read only memory cells and random access memory cells arranged in rows and columns to form a memory cell array;
 (b) a plurality of word lines each operative to activate said memory cells of each row in said read-out mode and said write-in mode;
 (c) a plurality of first data lines each operative to propagate a voltage level;
 (d) a plurality of second data lines each paired with each of said first data lines to form a data line pair coupled to said memory cells of each column, each of said second data lines being operative to propagate the complementary voltage level of said voltage level on the first data line, said voltage level and the complementary voltage level representing a bit of data information; and
 (d) a plurality of read-write buffer circuits each coupled to each of said data line pair so as to transfer said bit of data information thereto and shifted from said read-out mode to said write-in mode in the presence of a write control signal of a positive voltage level, wherein each of said read only memory cells comprises a series combination of two field effect transistors capable of providing a conduction path between one of said first and second data lines and a source of ground voltage in said read-out mode, said two field effect transistors having respective gate electrodes one of which is coupled to one of said word lines and the other of which is coupled to the other of said first and second data lines.

7. A semiconductor memory device fabricated on a semiconductor substrate and having a read-out mode and a write-in mode, comprising:
 (a) a plurality of read only memory cells and random access memory cells arranged in rows and columns to form a memory cell array;
 (b) a plurality of word lines each operative to activate said memory cells of each row in said read-out mode and write-in mode;
 (c) a plurality of first data lines each operative to propagate a voltage level;
 (d) a plurality of second data lines each paired with each of said first data lines to form a data line pair coupled to said memory cells of each column, each of said second data lines being operative to propagate the complementary voltage level of said voltage level on the first data line, said voltage level and the complementary voltage level representing a bit of data information; and
 (d) a plurality of read-write buffer circuits each coupled to each of said data line pair so as to transfer said bit of data information thereto and shifted from said read-out mode to said write-in mode in the presence of a write control signal of a positive voltage level, wherein each of said read only memory cells comprises a series combination of two field effect transistors capable of providing a conduction path between one of said first and second data lines and a source of ground voltage in said read-out mode, said two field effect transistors having respective gate electrodes one of which is coupled to one of said word lines and the other of which is supplied with the inverse of said write control signal in said write-in mode.

* * * * *

UNITED STATES PATENT AND TRADEMARK OFFICE
CERTIFICATE OF CORRECTION

PATENT NO. : 4,802,126
DATED : January 31, 1989
INVENTOR(S) : Shigeru Takayama

It is certified that error appears in the above-identified patent and that said Letters Patent is hereby corrected as shown below:

Column 4, line 49, delete "operating" and insert --operation--.

Column 5, line 44, delete "on" and insert --one--.

Column 6, line 56, delete "comprises", first occurrence.

Column 7, line 68, delete "149", second occurrence, and insert --140--.

Column 10, line 12, delete "and" and insert --to--.

Signed and Sealed this

Fifth Day of December, 1989

*Attest:*

JEFFREY M. SAMUELS

*Attesting Officer*   *Acting Commissioner of Patents and Trademarks*